(12) United States Patent
Masuda

(10) Patent No.: US 7,913,204 B2
(45) Date of Patent: Mar. 22, 2011

(54) HIGH-LEVEL SYNTHESIS APPARATUS, HIGH-LEVEL SYNTHESIS SYSTEM AND HIGH-LEVEL SYNTHESIS METHOD

(75) Inventor: Atsushi Masuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 317 days.

(21) Appl. No.: 12/252,643

(22) Filed: Oct. 16, 2008

(65) Prior Publication Data

US 2009/0164967 A1 Jun. 25, 2009

(30) Foreign Application Priority Data

Dec. 25, 2007 (JP) ................................. 2007-331971

(51) Int. Cl.
*G06F 17/50* (2006.01)
(52) U.S. Cl. ........ 716/104; 716/103; 716/132; 716/136; 703/16
(58) Field of Classification Search ................ 716/4, 18, 716/103, 104, 106, 132, 136; 703/16
See application file for complete search history.

(56) References Cited

U.S. PATENT DOCUMENTS

| | | | | |
|---|---|---|---|---|
| 5,854,929 | A * | 12/1998 | Van Praet et al. | 717/156 |
| 6,832,363 | B2 * | 12/2004 | Ohnishi | 716/18 |
| 6,968,523 | B2 * | 11/2005 | Masuda | 716/6 |
| 7,120,903 | B2 * | 10/2006 | Toi et al. | 717/149 |
| 7,266,791 | B2 * | 9/2007 | Morishita et al. | 716/4 |
| 2002/0188923 | A1 * | 12/2002 | Ohnishi | 716/18 |
| 2003/0061601 | A1 * | 3/2003 | Toi et al. | 717/144 |
| 2004/0111684 | A1 * | 6/2004 | Masuda | 716/3 |
| 2004/0123249 | A1 * | 6/2004 | Sato et al. | 716/1 |
| 2005/0010387 | A1 * | 1/2005 | Morishita et al. | 703/14 |
| 2006/0130029 | A1 * | 6/2006 | Morishita et al. | 717/157 |

OTHER PUBLICATIONS

Miyaoka et al., "A CoSynthesis Algorithm for Application Specific Processors With Heterogeneous Datapaths", Proceedings of the ASP-DAC 2004 Design Automation Conference, Jan. 27-30, 2004, pp. 250-255.*

Srinivasan et al., "Fine-Grained and Coarse-Grained Behavioral Partitioning with Effective Utilization of Memory and Design Space Exploration for Multi-FPGA Architectures", IEEE Transactions on Very Large Scale Integration (VLSI) Systems, vol. 9, No. 1, Feb. 2001, pp. 140-158.*

Theobald et al., "Transformations for the Synthesis and Optimization of Asynchronous Distributed Control", Proceedings of 2001 Design Automation Conference, 2001, pp. 263-268.*

* cited by examiner

*Primary Examiner* — Phallaka Kik
(74) *Attorney, Agent, or Firm* — Oblon, Spivak, McClelland, Maier & Neustadt, L.L.P.

(57) ABSTRACT

A high-level synthesis apparatus for automatically generating a register transfer level (RTL) logic circuit from a behavioral description has a scheduling unit configured to perform data flow analysis and scheduling to generate a data flow graph showing an operation cycle of an operation from the behavioral description, a scheduling result inputting/outputting unit configured to extract a point to be allocated to a register from the data flow graph and output register information indicating the point, the scheduling result inputting/outputting unit being provided with dynamic analysis data that includes at least one of the number of times that data at the point has been substituted and the number of times that a value stored at the point has changed by a predetermined simulation, an allocating unit configured to consult dynamic analysis data and allocate circuit elements to the behavioral description, and an RTL description generating unit configured to generate the logic circuit based on the allocation of circuit elements by the allocating unit.

20 Claims, 7 Drawing Sheets

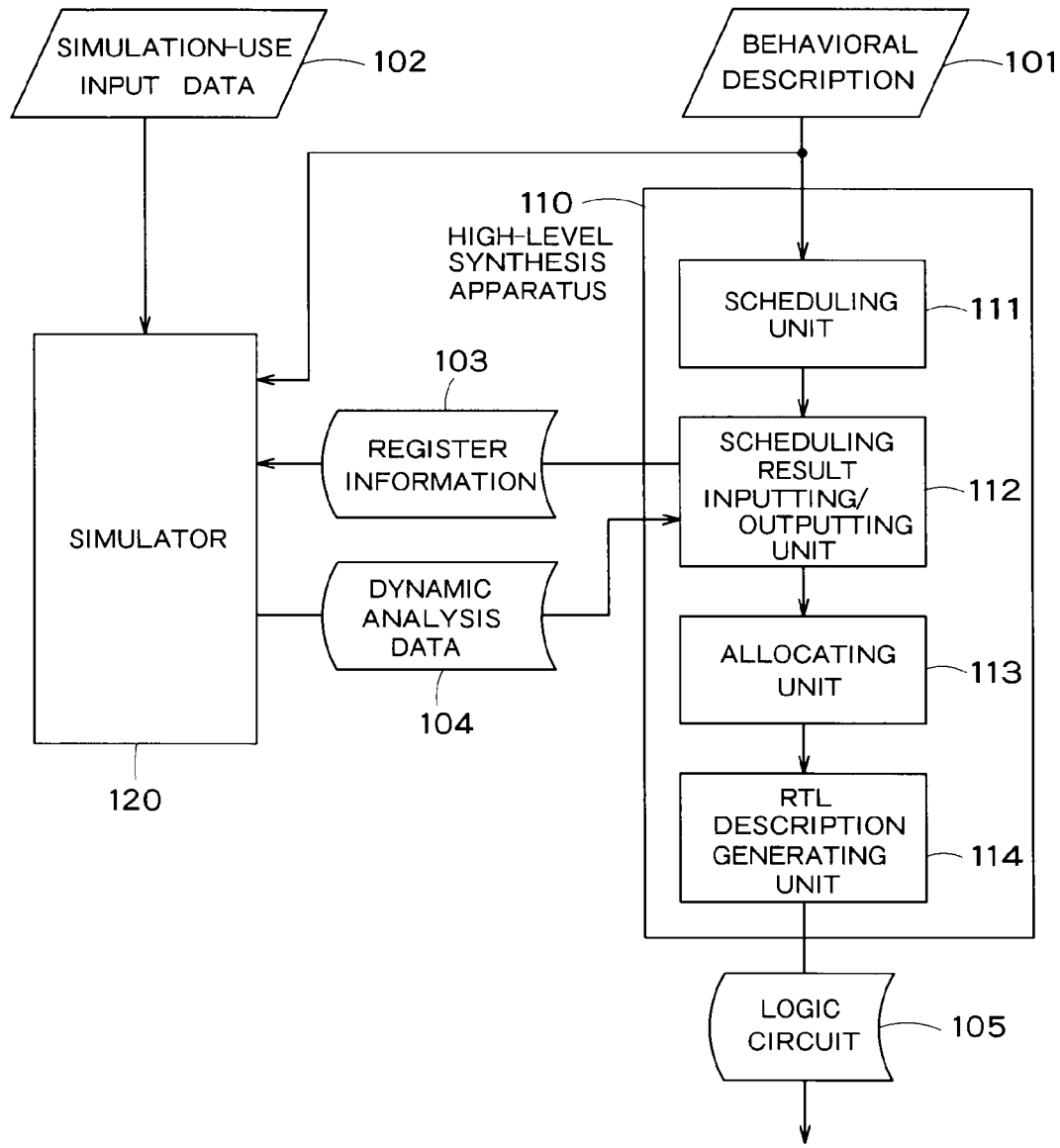
F I G. 1
out0=((in0−in1)*(in2+in3))/(in4+in5) ;
F I G. 2 p0=in0−in1 ;
p1=in2+in3 ;
p2=p0*p1 ;
p3=in4+in5 ;
p4=p2/p3 ;
out0=p4 ;

| EXECUTIONS COUNT | in0 | in1 | in2 | in3 | in4 | in5 | p0 | p1 | p2 | p3 | p4 |
|---|---|---|---|---|---|---|---|---|---|---|---|
| 1 | 14 | 11 | 3 | 2 | 2 | 2 | 3 | 5 | 15 | 4 | 3 |
| 2 | 7 | 4 | 3 | 3 | 2 | 2 | 3 | 6 | 18 | 4 | 4 |
| 3 | 12 | 9 | 9 | 10 | 2 | 2 | 3 | 19 | 57 | 4 | 14 |
| 4 | 9 | 6 | 7 | 1 | 2 | 2 | 3 | 8 | 24 | 4 | 6 |
| 5 | 10 | 7 | 8 | 2 | 2 | 2 | 3 | 10 | 30 | 4 | 7 |
| 6 | 11 | 8 | 10 | 6 | 2 | 3 | 3 | 16 | 48 | 5 | 9 |
| 7 | 6 | 3 | 6 | 2 | 2 | 3 | 3 | 8 | 24 | 5 | 4 |
| 8 | 8 | 5 | 1 | 10 | 2 | 3 | 3 | 11 | 33 | 5 | 6 |
| 9 | 5 | 2 | 1 | 4 | 2 | 3 | 3 | 5 | 15 | 5 | 3 |
| 10 | 13 | 10 | 7 | 6 | 2 | 3 | 3 | 13 | 39 | 5 | 7 |

F I G. 5

| POINT | NUMBER OF SUBSTITUTIONS | NUMBER OF CHANGES |
|---|---|---|
| p0 | 10 | 1 |
| p1 | 10 | 10 |
| p2 | 10 | 10 |
| p3 | 10 | 2 |
| p4 | 10 | 10 |

F I G. 6

| REGISTER | GROUPED POINTS | | |
|---|---|---|---|
| R0001 | p0 | p3 | |
| R0002 | p1 | p2 | p4 |

F I G. 7

```
if (c0)
  x=in0 ;
else
  x=in0+in1-in2 ;
if (c1)
  y=in3 ;
else
  y=in3-in4+in5
out0=x+in3+y ;
```
F I G. 10
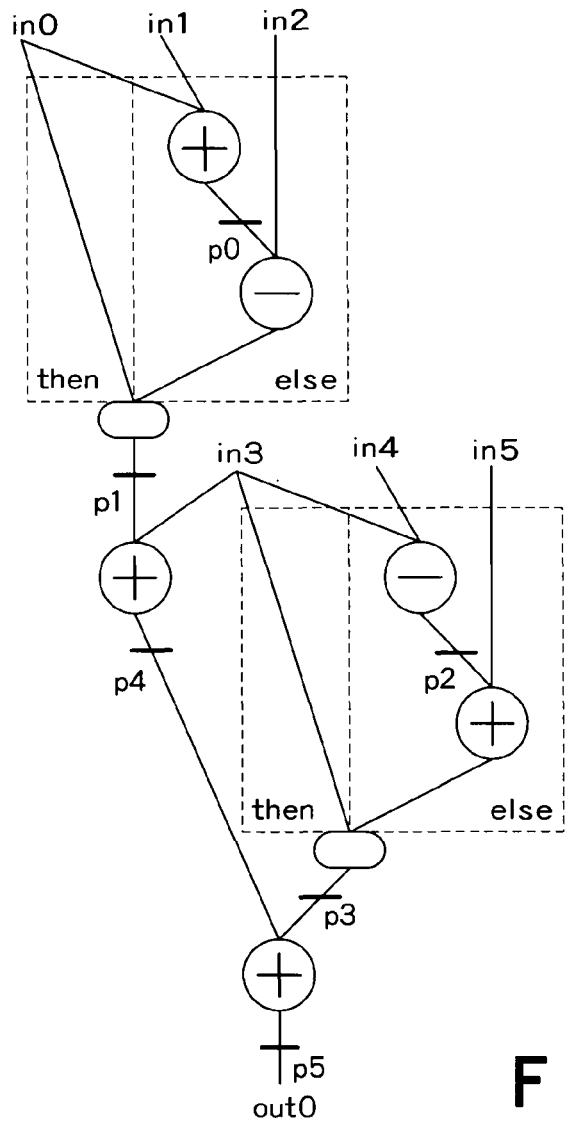
F I G. 11

```
if (c0)
    x=in0 ;
else {
    p0=in0+in1 ;
    x=p0-in2 ;
}
p1=x ;
if (c1)
    y=in3 ;
else {
    p2=in3-in4 ;
    y=p2+in5 ;
}
p3=y ;
p4=x+in3 ;
p5=p4+y ;
out0=p5 ;
```

F I G. 12

| EXECUTION COUNT | c0 | c1 | in0 | in1 | in2 | in3 | in4 | in5 | p0 | p1 | p2 | p3 | p4 | p5 |
|---|---|---|---|---|---|---|---|---|---|---|---|---|---|---|
| 0 | 1 | 1 | 11 | 6 | 7 | 1 | 6 | 3 | 0 | 11 | 0 | 1 | 12 | 13 |
| 1 | 1 | 1 | 11 | 3 | 1 | 0 | 7 | 7 | 0 | 11 | 0 | 0 | 11 | 11 |
| 2 | 1 | 0 | 8 | 6 | 0 | 1 | 2 | 4 | 0 | 8 | −1 | 3 | 9 | 12 |
| 3 | 0 | 1 | 9 | 3 | 6 | 3 | 4 | 3 | 12 | 6 | −1 | 3 | 9 | 12 |
| 4 | 1 | 1 | 2 | 5 | 1 | 0 | 0 | 0 | 12 | 2 | −1 | 0 | 2 | 2 |
| 5 | 1 | 1 | 3 | 7 | 3 | 2 | 7 | 7 | 12 | 3 | −1 | 2 | 5 | 7 |
| 6 | 0 | 0 | 5 | 4 | 0 | 0 | 0 | 7 | 9 | 9 | 0 | 7 | 9 | 16 |
| 7 | 1 | 1 | 11 | 7 | 5 | 7 | 3 | 3 | 9 | 11 | 0 | 7 | 18 | 25 |
| 8 | 1 | 1 | 8 | 0 | 5 | 0 | 1 | 4 | 9 | 8 | 0 | 0 | 8 | 8 |
| 9 | 0 | 1 | 3 | 7 | 7 | 2 | 6 | 3 | 10 | 3 | 0 | 2 | 5 | 7 |

F I G. 13

| POINT | NUMBER OF SUBSTITUTIONS | NUMBER OF CHANGES |
|---|---|---|
| p0 | 3 | 4 |
| p1 | 10 | 9 |
| p2 | 2 | 3 |
| p3 | 10 | 8 |
| p4 | 10 | 9 |
| p5 | 10 | 9 |

F I G. 14

| REGISTER | GROUPED POINTS | | |
|---|---|---|---|
| R0001 | p0 | p2 | p3 |
| R0002 | p1 | p4 | p5 |

F I G. 15

| REGISTER | GROUPED POINTS | | |
|---|---|---|---|
| R0001 | p0 | p2 | |
| R0002 | p1 | p4 | p5 |
| R0003 | p3 | | |

F I G. 16

HIGH-LEVEL SYNTHESIS APPARATUS, HIGH-LEVEL SYNTHESIS SYSTEM AND HIGH-LEVEL SYNTHESIS METHOD

CROSS REFERENCE TO RELATED APPLICATIONS

This application is based upon and claims benefit of priority from the Japanese Patent Application No. 2007-331971, filed on Dec. 25, 2007, the entire contents of which are incorporated herein by reference.

BACKGROUND OF THE INVENTION

1. Field of the Invention

The present invention relates to a high-level synthesis apparatus, a high-level synthesis system, and a high-level synthesis method.

2. Related Art

As semiconductor integrated circuits have grown smaller, the scale of the system LSI which can be mounted on a single chip has increased. An example of a known method for designing a large-scale system efficiently in a short period of time is high-level synthesis in which a behavioral description describing only the behavior of the system (logic circuit) is created using a high-level language such as the C language, and a RTL (Register Transfer Level) description including hardware information such as clock cycles, registers and operators is synthesized from the behavioral description.

In high-level synthesis, logic circuit design is performed based on indicators for which static analysis is simple, such as area and delay times, but power consumption which is a dynamic characteristic is not taken into account. A well-known technique for lowering the power consumption of logic circuits is to stop supplying the clock using gated clock circuits. However, if gated clock circuits are employed in all the logic circuits, the scale of the circuit increases. Moreover, for the logic circuits with only short intervals between periods of operation, the clock supply can rarely be stopped and the saving in power consumption is small.

Conventional high-level synthesis thus had a problem in that it was not possible to design logic circuits offering significant power saving while suppressing increases in circuit scale.

SUMMARY OF THE INVENTION

According to one aspect of the present invention, there is provided a high-level synthesis apparatus for automatically generating a register transfer level (RTL) logic circuit from a behavioral description, comprising:

a scheduling unit configured to perform data flow analysis and scheduling to generate a data flow graph showing an operation cycle of an operation from the behavioral description;

a scheduling result inputting/outputting unit configured to extract a point to be allocated to a register from the data flow graph and output register information indicating the point, the scheduling result inputting/outputting unit being provided with dynamic analysis data that includes at least one of the number of times that data at the point has been substituted and the number of times that a value stored at the point has changed by a predetermined simulation;

an allocating unit configured to consult dynamic analysis data and allocate circuit elements to the behavioral description; and an RTL description generating unit configured to generate the logic circuit based on the allocation of circuit elements by the allocating unit.

According to one aspect of the present invention, there is provided a high-level synthesis system for automatically generating a register transfer level (RTL) logic circuit from a behavioral description, comprising:

a scheduling unit configured to perform data flow analysis and scheduling to generate a data flow graph showing an operation cycle of an operation from the behavioral description;

a scheduling result inputting/outputting unit configured to extract a point to be allocated to a register from the data flow graph, and output register information indicating the point;

a simulator provided with predetermined simulation data, the behavioral description and the register information, the simulator executing a simulation using the predetermined simulation data in the behavioral description, generating dynamic analysis data including at least one of the number of data substitutions and the number of changes to a stored value at the point indicated in the register information, and outputting the generated dynamic analysis data;

an allocating unit configured to consult the dynamic analysis data and allocate circuit elements to the behavioral description; and an RTL description generating unit configured to generate the logic circuit based on allocation of circuit elements by the allocating unit.

According to one aspect of the present invention, there is provided a A high-level synthesis method for automatically generating a register transfer level (RTL) logic circuit from a behavioral description, comprising:

performing data flow analysis and scheduling to generate a data flow graph showing an operation cycle of an operation from the behavioral description;

extracting a point to be allocated to a register from data flow graph, and executing a simulation using predetermined simulation data for the behavioral description;

generating dynamic analysis data that includes at least one of the number of data substitutions at the point or the number of changes to a stored value at the point from results of the simulation;

consulting the dynamic analysis data and allocating circuit elements to the behavioral description; and generating the logic circuit based on the allocation of the circuit elements.

BRIEF DESCRIPTION OF THE DRAWINGS

FIG. 1 is a diagram showing a schematic configuration of the high-level synthesis system according to an embodiment of the present invention;

FIG. 2 shows an example of a behavioral description;

FIG. 5 shows an example of simulation-use input data and corresponding simulation results;

FIG. 6 shows an example of dynamic analysis data;

FIG. 7 shows an example of register allocation in allocation processing;

FIG. 10 shows an example of a behavioral description;

FIG. 11 shows an example of a data flow graph;

FIG. 12 shows an example of internal states created from the behavioral description and the register information;

FIG. 13 shows an example of simulation-use input data and simulation results;

FIG. 14 shows an example of dynamic analysis data;

FIG. 15 shows an example of register allocation in allocation processing; and

FIG. 16 shows a further example of register allocation in allocation processing.

DESCRIPTION OF THE EMBODIMENTS

Figures 3, 4:
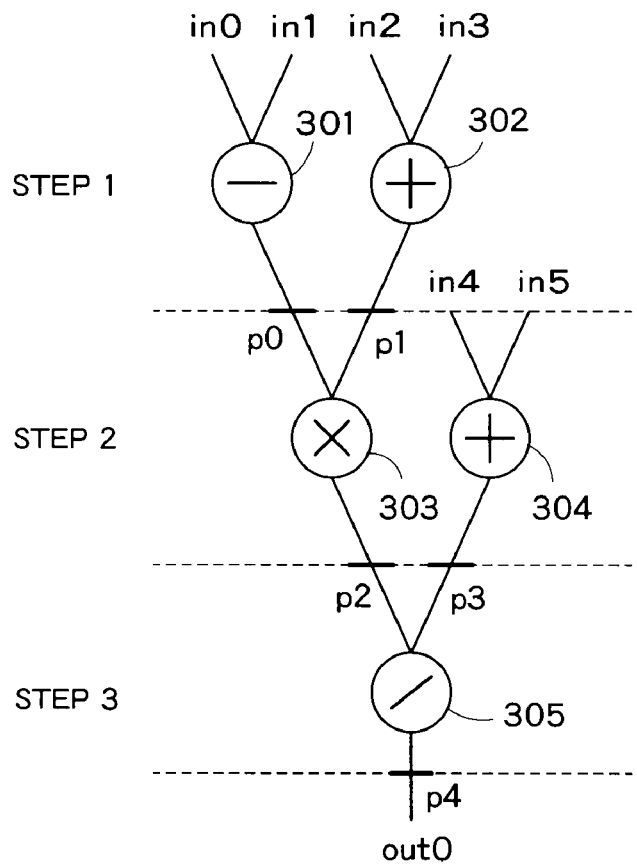
FIG. 3 shows an example of a data flow graph.
FIG. 4 shows an example of internal states created from the behavioral description and register information.

The following describes embodiments of the present invention with reference to the drawings.

FIG. 1 shows a schematic configuration of a high-level synthesis system according to an embodiment of the present invention. The high-level synthesis system includes a high-level synthesis apparatus 110 and a simulator 120.

The high-level synthesis apparatus 110 includes a scheduling unit 111, a scheduling result inputting/outputting unit 112, an allocating unit 113, and a RTL description generating unit 114.

The high-level synthesis apparatus 110 is provided with a behavioral description 101. The behavioral description 101 defines the processing content from the input of the circuit to the output of the circuit, and may be written in C or a similar programming language. An example of (part of) a behavioral description is shown in FIG. 2.

The scheduling unit 111 analyzes the data flow and determines the operation cycles (time steps) at which operations in the behavioral description 101 are executed. Data from between differing time steps are held in storage elements (such as registers, latches, or memory).

The scheduling result inputting/outputting unit 112 outputs information about the points (operation device output) which are to be allocated to the storage elements, as register information 103.

FIG. 3 shows a data flow graph generated by analyzing and scheduling the data flow of the behavioral description shown in FIG. 2. From FIG. 3, it can be seen that a subtraction operator 301 and an addition operator 302 are allocated to step 1, a multiplication operator 303 and an addition operator 304 are allocated to step 2, and a division operator 305 is allocated to step 3.

Further, the points p0 to p4 between the steps and at the outputs of the operators are allocated to storage elements, and the points are indicated in the register information 103.

The simulator 120 is supplied with the behavioral description 101, simulation-use input data 102, and the register information 103. The simulation-use input data is data (sample data) which is actually to be processed using the logic circuits designed using the high-level synthesis system. For instance, when designing a circuit for image processing, image data is used as the simulation-use input data 102.

The simulator 120 specifies the points to be allocated to the storage elements (locations indicated by the register information 103) from the behavioral description 101 and the register information 103. The simulator 120 then performs a simulation using the simulation-use input data 102, and stores the data at the points indicated by the register information 103.

For instance, from the behavioral description shown in FIG. 2 and the register information shown in FIG. 3, internal states of the type shown in FIG. 4 are created and values for the points p0 to p4 which actually change when the simulation is performed are stored.

The simulator 120 performs analysis on the stored data. For instance, the simulator 120 may detect the number of times that a value (data) is substituted at each point or the number of times that a value is changed at each point. The simulator 120 outputs the results of the analysis as dynamic analysis data 104.

For the internal states shown in FIG. 4, an example of the simulation-use input data and values for each point are shown in FIG. 5. FIG. 5 shows the results of executing the simulation with 10 sets of prepared simulation-use input data. In FIG. 5, the count column contains an execution count, columns in0 to in5 contain input data and p0 to p4 contain values of the points indicated by the register information.

FIG. 6 is an example of the dynamic analysis data obtained by analyzing the simulation results shown in FIG. 5. The number of substitutions column contains the number of times the value has been substituted at each point. The number of changes column contains the number of times that the value of each point differs from the preceding value after execution of the simulation. From FIG. 6, it can be seen that the number of changes is fewer for points p0 and p3.

The dynamic analysis data 104 is inputted to the scheduling result inputting/outputting unit 112 of the high-level synthesis apparatus 110.

The allocating unit 113 performs allocation processing using the behavioral description 101, the data flow graph and the dynamic analysis data 104. The allocation processing is processing to allocate circuit elements (operation devices and the like) for the behavioral description and synthesize logic circuits.

The allocating unit 113 consults the dynamic analysis data 104 and allocates registers (storage elements) to the points indicated by the register information 103. For instance, points for which the number of value substitutions or value changes is small may be grouped and allocated to the same register.

For example, from the dynamic analysis data shown in FIG. 6, it is decided to allocate the points p0 and p3 to a single register R0001 and the remaining points, p1, p2 and p4 to a different register R0002 as shown in FIG. 7.

The RTL description generating unit 114 generates a RTL (Register Transfer Level) circuit description 105 using data from after the allocation processing, and outputs the generated RTL circuit description.

In logic circuits designed in this way, the use of the clock supply stopping circuit is restricted to registers allocated to points for which the number of value substitutions or value changes is small. In other words, gated clock registers are allocated to points for which the number of value substitutions or value changes is small.

Figure 8:
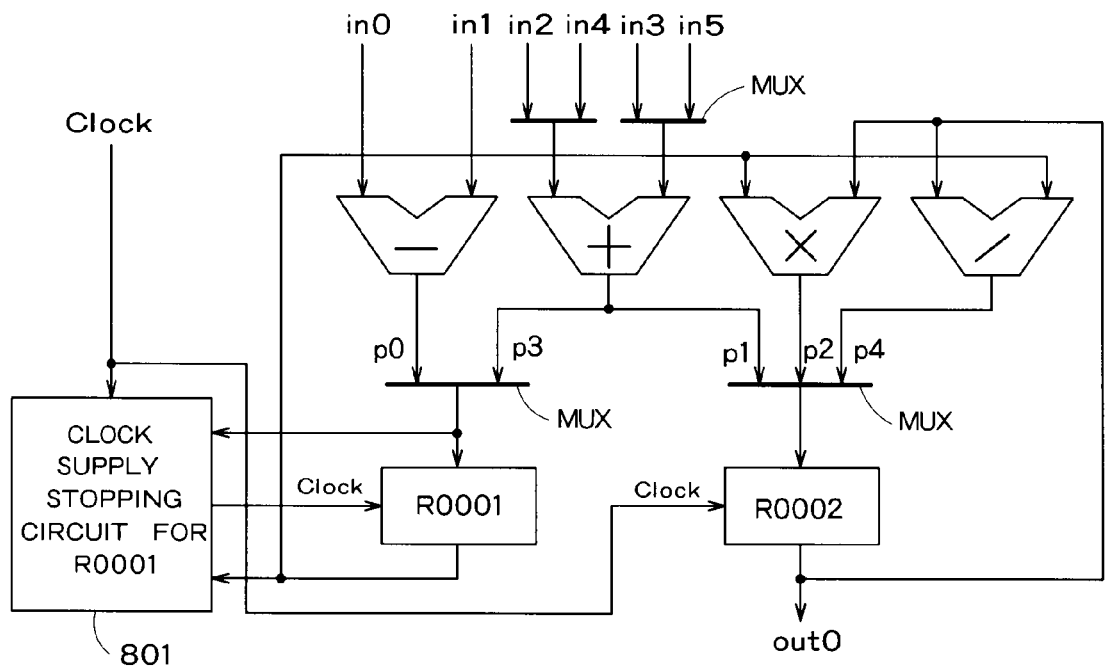
FIG. 8 is a diagram showing an example of a circuit employing a clock supply stopping circuit.

In the example shown in FIG. 2 to FIG. 7, for instance, a clock supply stopping circuit 801 is used in the register R0001 alone as shown in FIG. 8 to supply a gated clock signal.

Thus, the points for which the number of value substitutions or number of value changes is small are grouped and allocated to the same register. By restricting use of the clock supply stopping circuit to the register, it is possible to efficiently design logic circuits with low power consumption. Moreover, in comparison to the case in which the clock supply stopping circuit is used in all of the registers, the number of clock supply stopping circuits can be reduced, and, as a result, an increase in circuit scale can be suppressed.

Figure 9:
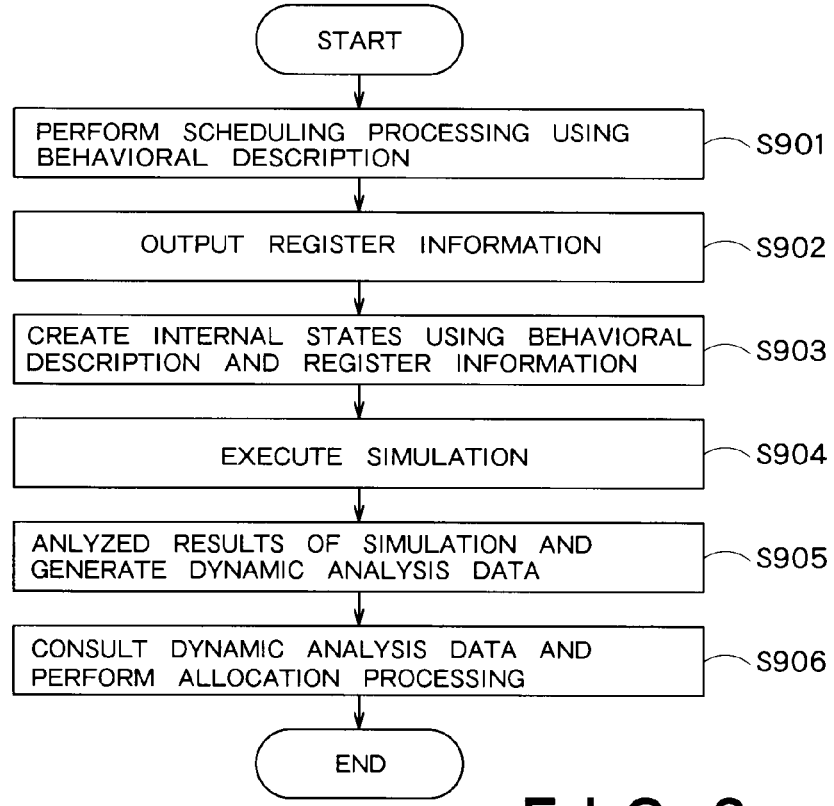
FIG. 9 is a flowchart describing a high-level synthesis method according to the embodiment.

The high-level synthesis method according to the present embodiment is described using the flowchart shown in FIG. 9 and a different example to that shown in FIGS. 2 to 7.

(Step S901) Data flow analysis using the behavioral description and scheduling processing are performed. A further example of a behavioral description is shown in FIG. 10, and the data flow graph obtained as a result of the scheduling is shown in FIG. 11.

(Step S902) The register information indicating the points to be allocated to the registers is outputted. In the example shown in FIG. 11, the register information includes information for the points p0 to p5.

(Step S903) The internal states are created using the behavioral description and the register information, and the locations for storing the data (operation results) during the simulation are specified. From the behavioral description shown in FIG. 10 and the register information shown in FIG. 11, internal states of the type shown in FIG. 12 are created.

(Step S904) A simulation is executed using the simulation-use input data, and values for each point are stored. An example of the simulation-use input data and the values of the points p0 to p5 obtained in the internal state shown in FIG. 12 when the simulation using the simulation-use input data is performed are shown in FIG. 13.

(Step S905) Analysis on the stored data is performed to generate dynamic analysis data, and the dynamic analysis data is outputted. The dynamic analysis data may include, for instance, the number of substitutions and number of changes of the variable for each point.

For instance, dynamic analysis data of the type shown in FIG. 14 is generated from the simulation results shown in FIG. 13. From the dynamic analysis data, it is clear that the number of substitutions for the points p0 and p2 is small.

(Step S906) Allocation processing is performed. The dynamic analysis data is consulted during register allocation.

For instance, upon consulting the dynamic analysis data shown in FIG. 14, the points p0, p2, and p3 may be allocated to a single register R0001 and the points p1, p4, and p5 may be allocated to a single register R0002, as shown in FIG. 15.

Here, the points p0 and p2 for which the number of substitutions is small, and, in addition, the point p3 have been allocated to the register R0001. The additional allocation is used here because, as can be seen from the FIG. 11, data from the points p3 and p4 are to be stored simultaneously and so it is necessary to allocate one of the points p3 and p4 to the register R0001.

As shown in FIG. 16, an alternative is to allocate only the points p0 and p2 to the register R0001 and to allocate the point p3 to a new register R0003. In this case, although the power consumption of the register R0001 is reduced effectively, the increase in the number of registers means that it is necessary to consider the increase in power consumption resulting from the increase in circuit scale.

Thus, in the present embodiment, a simulation is performed using data that is actually going to be processed with the designed logic circuit, and points for which the number of data substitutions or the number of changes to the stored value is small are grouped based on the results of the simulation and allocated to a register. Then, since the use of the clock supply stopping circuit is restricted to registers for which power consumption is lowered significantly by providing a gated clock is large, it is possible to design a logic circuit with lower power consumption while suppressing increases in circuit size.

In the above-described embodiment, it may look as if the simulation is being performed during operations of the high-level synthesis apparatus 110. However, if the behavioral description 101 used in the high-level synthesis and the parameters match, the register information 103 will be the same. Hence, it is possible to obtain a plurality of dynamic analysis data 104 from the register information 103 and a plurality of simulation-use input data 102, and obtain a plurality of differing circuit descriptions 105.

In the above-described embodiment, the number of data substitutions or number of changes was detected from the results of the simulation. However, the register is physically generated bit by bit, and so the probability of each bit being "1" may be calculated and included in the dynamic analysis information.

What is claimed is:

1. A high-level synthesis apparatus for automatically generating a register transfer level (RTL) logic circuit from a behavioral description, comprising:
    a scheduling unit configured to perform data flow analysis and scheduling to generate a data flow graph showing an operation cycle of an operation from the behavioral description;
    a scheduling result inputting/outputting unit configured to extract a point to be allocated to a register from the data flow graph and output register information indicating the point, the scheduling result inputting/outputting unit being provided with dynamic analysis data that includes at least one of a number of times that data at the point has been substituted and a number of times that a value stored at the point has changed by a predetermined simulation;
    an allocating unit configured to consult dynamic analysis data and allocate circuit elements to the behavioral description; and
    an RTL description generating unit configured to generate the logic circuit based on the allocation of circuit elements by the allocating unit.

2. The high-level synthesis apparatus according to claim 1, wherein the scheduling result inputting/outputting unit detects an operator from the data flow graph and extracts an output portion of the operator as the point to be allocated to the register.

3. The high-level synthesis apparatus according to claim 1, wherein the allocating unit uses the dynamic analysis data to group the point with other points based on one of the number of data substitutions and the number of changes to the stored value, and allocates a register to each group.

4. The high-level synthesis apparatus according to claim 1, wherein the dynamic analysis data includes information about a probability of each register bit at the point being "1".

5. The high-level synthesis apparatus according to claim 1, wherein the allocating unit consults the dynamic analysis data, groups points for which the number of data substitutions is less than or equal to a predetermined value, and allocates a gated clock register to the grouped points.

6. The high-level synthesis apparatus according to claim 5, wherein points for which the number of data substitutions is larger than the predetermined value and data are not being stored simultaneously are grouped, and a single register is allocated to the grouped points.

7. The high-level synthesis apparatus according to claim 1, wherein the allocating unit consults the dynamic analysis data, groups points for which the number of changes to the stored value is less than or equal to a predetermined value, and allocates a gated clock register to the grouped points.

8. The high-level synthesis apparatus according to claim 7, wherein points for which the number of changes to the stored value is larger than the predetermined value and data are not being stored simultaneously are grouped, and a single register is allocated to the grouped points.

9. A high-level synthesis system for automatically generating a register transfer level (RTL) logic circuit from a behavioral description, comprising:
    a scheduling unit configured to perform data flow analysis and scheduling to generate a data flow graph showing an operation cycle of an operation from the behavioral description;

a scheduling result inputting/outputting unit configured to extract a point to be allocated to a register from the data flow graph, and output register information indicating the point;

a simulator provided with predetermined simulation data, the behavioral description and the register information, the simulator executing a simulation using the predetermined simulation data in the behavioral description, generating dynamic analysis data including at least one of a number of data substitutions and a number of changes to a stored value at the point indicated in the register information, and outputting the generated dynamic analysis data;

an allocating unit configured to consult the dynamic analysis data and allocate circuit elements to the behavioral description; and an RTL description generating unit configured to generate the logic circuit based on allocation of circuit elements by the allocating unit.

10. The high-level synthesis system according to claim 9, wherein the scheduling result inputting/outputting unit detects an operator from the data flow graph and extracts an output portion of the operator as the point to be allocated to the register.

11. The high-level synthesis system according to claim 9, wherein the allocating unit uses the dynamic analysis data to group the point with other points based on at least one of the number of data substitutions and the number of changes to the stored value, and allocates a register to each group.

12. The high-level synthesis system according to claim 9, wherein the simulator generates a dynamic analysis data including information about the probability of each register bit at the point being "1", and outputs the generated dynamic analysis data.

13. The high-level synthesis system according to claim 9, wherein the allocating unit consults the dynamic analysis data, groups points for which the number of data substitutions is less than or equal to a predetermined value, and allocates a gated clock register to the grouped points.

14. The high-level synthesis system according to claim 13, wherein the allocating unit groups points for which the number of data substitutions is larger than the predetermined value and data are not being saved simultaneously, and allocates a single register to the grouped points.

15. The high-level synthesis system according to claim 9, wherein the allocating unit consults the dynamic analysis data, groups points for which the number of changes to a stored value is less than or equal to a predetermined value, and allocates a gated clock register to the grouped points.

16. The high-level synthesis system according to claim 15, wherein the allocating unit groups points for which the number of changes to the stored value is larger than the predetermined value and data are not being saved simultaneously, and allocates a single register to the grouped points.

17. A high-level synthesis method for automatically generating a register transfer level (RTL) logic circuit from a behavioral description, comprising:

performing, using a processor, data flow analysis and scheduling to generate a data flow graph showing an operation cycle of an operation from the behavioral description;

extracting a point to be allocated to a register from data flow graph, and executing a simulation using predetermined simulation data for the behavioral description;

generating dynamic analysis data that includes at least one of a number of data substitutions at the point or a number of changes to a stored value at the point from results of the simulation;

consulting the dynamic analysis data and allocating circuit elements to the behavioral description; and generating the logic circuit based on the allocation of the circuit elements.

18. The high-level synthesis method according to claim 17, further comprising:

consulting the dynamic analysis data, grouping the point with other points based on at least one of the number of data substitutions and the number of changes to the stored value, and allocating a register to each group.

19. The high-level synthesis method according to claim 17, further comprising:

consulting dynamic analysis data, grouping points for which the number of changes to the stored value is less than or equal to a predetermined value are grouped, and allocating a gated clock register to the grouped points.

20. The high-level synthesis method according to claim 19, further comprising:

grouping points for which the number of the changes to the stored value is larger than the predetermined value and data are not being stored simultaneously, and allocating a single register to the grouped points.

* * * * *